United States Patent
Sano et al.

(10) Patent No.: US 7,789,976 B2
(45) Date of Patent: Sep. 7, 2010

(54) LOW SURFACE ROUGHNESS ELECTROLYTIC COPPER FOIL AND PROCESS FOR PRODUCING THE SAME

(75) Inventors: Yasushi Sano, Takatsuki (JP); Naoshi Akamine, Kyoto (JP)

(73) Assignee: Fukuda Metal Foil & Powder Co., Ltd., Kyoto (JP)

( * ) Notice: Subject to any disclaimer, the term of this patent is extended or adjusted under 35 U.S.C. 154(b) by 664 days.

(21) Appl. No.: 10/555,356

(22) PCT Filed: May 12, 2004

(86) PCT No.: PCT/JP2004/006716
§ 371 (c)(1),
(2), (4) Date: Nov. 1, 2005

(87) PCT Pub. No.: WO2004/101859
PCT Pub. Date: Nov. 25, 2004

(65) Prior Publication Data
US 2006/0210823 A1 Sep. 21, 2006

(30) Foreign Application Priority Data
May 14, 2003 (JP) .............................. 2003-136365

(51) Int. Cl.
*C22C 9/05* (2006.01)
*C25D 3/38* (2006.01)
(52) U.S. Cl. ...................... 148/411; 428/606
(58) Field of Classification Search .................. 428/606
See application file for complete search history.

(56) References Cited

U.S. PATENT DOCUMENTS

| | | |
|---|---|---|
| 5,431,803 A | 7/1995 | DiFranco et al. |
| 5,834,140 A | 11/1998 | Wolski et al. |
| 5,863,410 A | 1/1999 | Yates et al. |
| 5,958,209 A * | 9/1999 | Sakai et al. ............. 205/585 |
| 6,231,742 B1 | 5/2001 | Sano et al. |

FOREIGN PATENT DOCUMENTS

| | | |
|---|---|---|
| JP | 7-188969 | 7/1995 |
| JP | 9-143785 | 6/1997 |
| JP | 10-330983 | 12/1998 |
| JP | 2000-64083 | 2/2000 |
| JP | 2002-506484 | 2/2002 |
| JP | 3313277 | 5/2002 |
| WO | WO98/59095 | 12/1998 |

* cited by examiner

*Primary Examiner*—Roy King
*Assistant Examiner*—Jie Yang
(74) *Attorney, Agent, or Firm*—Oliff & Berridge, PLC

(57) ABSTRACT

An electrodeposited copper foil with low surface roughness having a surface roughness $R_z$ not higher than 2.5 μm and an elongation percentage not smaller than 6% at 180° C. in which tensile strength at 25° C. measured within 20 min of the point in time of ending electrodeposition is not higher than 500 MPa and the lowering rate of tensile strength at 25° C. measured within 300 min of the point in time of ending electrodeposition is not higher than 10%. The electrodeposited copper foil with low surface roughness is produced by a process employing aqueous solution of sulfuric acid-copper sulfate as electrolyte and conducting a DC current between an insoluble anode of titanium coated with a platinum metal element or its oxide element and a titanium cathode drum facing the anode, wherein the electrolyte contains hydroxyethylcellulose, polyethyleneimine, a sulfonate of active organic sulfur compound, acetylene glycol and chlorine ions.

2 Claims, 3 Drawing Sheets

×1,000  10 μm

×1,000  10 μm

LOW SURFACE ROUGHNESS ELECTROLYTIC COPPER FOIL AND PROCESS FOR PRODUCING THE SAME

TECHNICAL FIELD

The present invention relates to an electrodeposited copper foil with low surface roughness having a low lowering rate of a tensile strength with time or accompanied with heat treatment, and having an excellent elongation rate at a high temperature, and a process for producing the same.

BACKGROUND ART

As well known, an electrodeposited copper foil is produced by a method of using an aqueous solution of sulfuric acid-copper sulfate as an electrolyte, filling the electrolyte between an insoluble anode of titanium coated with a platinum metal element or its oxide element and a titanium cathode drum disposed facing the anode, conducting a DC current between both electrodes while a cathode drum is rotated at a constant rate to precipitate copper on a cathode drum surface, peeling precipitated copper from a cathode drum surface, and continuously winding this.

In the present invention, a surface of a side on which an electrodeposited copper foil has been contacted with a cathode drum surface is referred to as "shiny side", and a reverse surface is referred to as "matte side".

The electrodeposited copper foil is produced as described above is called as "electrodeposited copper foil without treatment" by a person skilled in the art, and this is not used as this electrodeposited copper foil without treatment and, when an electrodeposited copper foil for a printing circuit is obtained, a roughening treatment step for the purpose of improving adherability with an insulating resin, and various surface treatment steps for the purpose of imparting heat resistance, chemical resistance and rust proofness are performed.

In old times, for the purpose of sharpening (roughening) a crest-root shape of a matte side and suppressing a pinhole, 10 to 100 mg/L of chlorine ion and 0.1 to 4.0 mg/L glue or gelatin have been added to an electrolyte in a step of producing an electrodeposited copper foil without treatment (see Table 1, Comparative Example 6 of Table 2, and FIG. 3, infra). However, in recent years, in a printed circuit board and a lithium ion secondary cell anode current collecting body which are utility of an electrodeposited copper foil, a thin electrodeposited copper foil having as low roughness as possible on a matte side, a small roughness difference between a shiny side and a matte side (since a shiny side copies a smooth shape of a cathode drum surface, a roughness difference necessarily occurs between a shiny side and a matte side), and an excellent elongation rate at a high temperature has been demanded.

This is because, in a printed circuit board, since a path difference between a signal flowing on a shiny side and a signal flowing on a matte side can be reduced by reducing roughness of a matte side upon occurrence of skin effect by speedup of a signal frequency, the effect of preventing delay of a signal and, at the same time, retaining a resistance between insulating layers in a multi-layered substrate is obtained and, by improving an elongation rate at a high temperature, the effect of following resin flow generated at lamination of a multi-layered substrate, and retaining connection reliance in a throughhole is obtained and, further, by thinning a foil, the effect of improving a circuit precision accompanied with finer line and fine patterning is obtained.

On the other hand, in a lithium ion secondary cell cathode current collecting body, by reducing roughness of a matte side, a difference in a surface area between a shiny side and a matte side can be reduced and, accompanying this, the effect of decreasing necessary considering of a difference in a cell reaction is obtained.

However, it is difficult to reduce a roughness difference between a shiny side and a matte side, and satisfy practical various mechanical properties.

Previously, in a process for producing an electrodeposited copper foil, it has been known that a roughness difference between a shiny side and a matte side can be reduced by appropriately selecting and adding various water-soluble polymer materials, various surfactants, various organic sulfur-based compounds, and a chlorine ion to an electrolyte. For example, Japanese Patent No. 3313277 discloses a process for producing an electrodeposited copper foil using an electrolyte to which a compound having a mercapto group, a chloride ion, as well as a low-molecular glue having a molecular weight of 10000 or smaller and a polymer polysaccharide have been added (page 1), and JP-A-2002-506484 discloses a process for producing an electrodeposited copper foil using an electrolyte to which low-molecular water-soluble cellulose ether such as hydroxyethylcellulose, low-molecular water-soluble polyalkylene glycol ether such as polyethylene glycol, low-molecular water-soluble polyethyleneimine and a water-soluble sulfonated organic sulfur compound have been added (page 2, pp. 18-22).

The present inventors performed many experiments for obtaining an electrodeposited copper foil by the processes for producing an electrodeposited copper foil disclosed in the above respective gazettes, and investigated various properties of the resulting electrodeposited copper foils, and found that, regarding an electrodeposited copper foil obtained by the process for producing an electrodeposited copper foil disclosed in Japanese Patent No. 3313277, a tensile strength at 25° C. measured within 20 minutes from completion of electrodeposition exhibits a high value of 800 MPa, but the tensile strength is reduced with time, and a tensile strength at 25° C. measured at 240 minutes after completion of electrodeposition is reduced from 800 MPa to around 350 MPa. In addition, it was also found out that the tensile strength is also reduced by heat treatment, and a tensile strength at 25° C. measured after heat treatment at 100° C. for 10 minutes is reduced from 800 MPa to 320 MPa (see Table 1, Comparative Example 7 of Table 2, and FIG. 1, infra).

This is thought as follows: in the case of the process for producing an electrodeposited copper foil disclosed in Japanese Patent No. 3313277, since a copper foil precipitated on a cathode drum is composed of small crystal particles, the small crystal particles tend to migrate to the thermodynamically stable state by minimizing a surface area at room temperature, primary recrystallization occurs at room temperature driven by interface energy at a crystal grain boundary, crystal particles become coarse, and remarkable reduction in a tensile strength occurs.

There is a problem that, when a tensile strength of an electrodeposited copper foil is reduced, a crease is easily formed upon thinning a foil, and handling property at lamination of a multi-layered substrate is deteriorated.

In addition, in the case of the process for producing an electrodeposited copper foil disclosed in JP-A-2002-506484, since a concentration of respective additives relative to an electrolyte is comparatively high, copper powders are precipitated at electrolysis, causing so-called scorching state, and an electrodeposited copper foil cannot be peeled from a cathode drum surface (see Table 1, Comparative Examples 8 and 9 of Table 2, infra).

Accordingly, a technical object of the present invention is to provide an electrodeposited copper foil with low surface roughness having an extremely low lowering rate of a tensile strength with time or accompanied with heat treatment, and having an excellent elongation rate at a high temperature, specifically, an electrodeposited copper foil with low roughness having a matte side roughness Rz of an electrodeposited copper foil of 2.5 μm or lower, a tensile strength at 25° C. measured within 20 minutes after completion of electrodeposition of 500 MPa or higher and, at the same time, a lowering rate of a tensile strength at 25° C. measured at 300 minutes after completion of electrodeposition of 10% or lower, or a lowering rate of a tensile strength at 25° C. measured after heat treatment at 100° C. for 10 minutes, and an elongation rate at 180° C. of 6% or higher.

The present inventors continued to intensively study in order to attain the aforementioned object and, as a result, obtained notable findings that, by the presence of five additives of hydroxyethylcellulose, polyethyleneimine, acetylene glycol, a sulfonate salt of an active organic sulfur compound, and a chlorine ion in an electrolyte comprising an aqueous solution of sulfuric acid-copper sulfate, an electrodeposited copper foil having a matte side roughness Rz of an electrodeposited copper foil of 2.5 μm or lower, a tensile strength at 25° C. measured within 20 minutes from completion of electrodeposition of 500 MPa or higher and, at the same time, a lowering rate of a tensile strength at 25° C. measured at 300 minutes after completion of electrodeposition of 10% or lower, or a lowering rate of a tensile strength at 25° C. measured after heat treatment at 100° C. for 10 minutes of 10% or lower, and an elongation rate at 180° C. of 6% or higher is obtained, accomplishing the aforementioned object.

DISCLOSURE OF THE INVENTION

That is, the present invention is an electrodeposited copper foil with low surface roughness characterized in that a matte side roughness Rz of an electrodeposited copper foil is 2.5 μm or lower, a tensile strength at 25° C. measured within 20 minutes from completion of electrodeposition is 500 MPa or higher and, at the same time, a lowering rate of a tensile strength at 25° C. measured at 300 minutes from completion of electrodeposition is 10% or lower, and an elongation rate at 180° C. is 6% or higher.

In addition, the present invention is an electrodeposited copper foil with low surface roughness, characterized in that a matte side roughness Rz of an electrodeposited copper foil is 2.5 μm or lower, a tensile strength at 25° C. measured within 20 minutes from completion of electrodeposition is 500 MPa or higher and, at the same time, a lowering rate of a tensile strength at 25° C. measured after 300 minutes from completion of electrodeposition as well as a lowering rate of a tensil strength at 25° C. measured after heat treatment at 100° C. for 10 minutes from completion of electrodeposition are 10% or lower, and an elongation rate at 180° C. is 6% or higher.

In addition, the present invention is a process for producing an electrodeposited copper foil with low surface roughness of using an acueous solution of sulfuric acid-copper sulfate as an electrolyte, using an insoluble anode of titanium covered with a platinum metal element or its oxide element and a titanium cathode drum facing the anode, and conducting a DC current between both electrodes, characterized in that hydroxyethyl-cellulose, polyethyleneimine, a sulfonate salt of an active organic sulfer compound, acetylene glycol and a chlorine ion are present in the electrolyte, and a molecular weight of the hydroxyethylcellulose is 250000 to 1600000.

In addition, the present invention is a process for producing an electrodeposited copper foil with low surface roughness of using an acueous solution of sulfuric acid-copper sulfate as an electrolyte, using an insoluble anode of titanium covered with a platinum metal element or its oxide element and a titanium cathode drum facing the anode, and conducting a DC current between both electrodes, characterized in that the sulfonate salt, acetylene glycol and chlorine ion are present in the electrolyte, and an average molecular weight of the polyethyleneimine is 10000 to 75000.

In addition, the present invention is a process for producing an electrodeposited copper foil with low surface roughness of using an aqueous solution of sulfuric acid-copper sulfate as an electrolyte, using an insoluble anode of titanium covered with a platinum metal element or its oxide element and a titanium cathode drum facing the anode, and conducting a DC current between both electrodes, characterized in that hydroxyethyl-cellulose, polyethyleneimine, a sulfonate salt of an active organic sulfur compound, acetylene glycol and a chlorine ion are present in the electrolyte, a concentration of the hydroxyethylcellulose relative to the electrolyte is 40 to 100 mg/L, and a concentration of the acetylene glycol relative to the electrolyte is 0.2 to 3.0 mg/L.

In addition, the present invention is a process for producing an electrodeposited copper foil with low surface roughness, wherein a mole concentration of the sulfonate salt of the active organic sulfur compound relative to the electrolyte is 5.5 to 450 μmol/L.

In addition, the present invention is a process for producing an electrodeposited copper foil with low surface roughness, wherein a concentration of the polyethyleneimine relative to the electrolyte is 10 to 40 mg/L.

In addition, the present invention is any one of the aforementioned processes for producing an electrodeposited copper foil with low surface roughness, wherein a sulfonate salt of an active organic sulfur compound is selected from a symmetric or asymmetric disulfidosulfonate salt represented by the general formula: $NaSO_3—R_1—S—S—R_2—SO_3Na$, and a sulfonate salt of thiol represented by the general formula: $HS—R_1—SO_3Na$ or the general formula: $HS—Ar—SO_3Na$.

Essential features of the present invention will be explained in more detail as follows.

In the present invention, an additive to be added to an electrode comprising an aqueous solution of sulfuric acid-copper sulfate is five additives of hydroxyethylcellulose, polyethyleneimine, a sulfonate salt of an active organic sulfur compound, acetylene glycol and a chlorine ion, and a desired electrodeposited copper foil with low surface roughness can be obtained only in a region that these additives have a constant concentration range, and a water-soluble polymer has a constant molecular weight range.

That is, hydroxyethylcellulose used in the present invention has a molecular weight of preferably 250000 to 1600000, more preferably 250000 to 1020000. In the case where a molecular weight is lower than 250000, even when the aforementioned other four additives are adjusted in each preferable concentration range described later, a roughness of a matte side is not reduced, and a tensile strength is remarkably reduced with time or accompanied with heat treatment. On the other hand, it is presumed that, even when a molecular weight exceeds 1600000, a desired electrodeposited copper foil with low surface roughness is obtained. Accordingly, an upper limit of a molecular weight does not determine properties of an electrodeposited copper foil with low surface roughness. However, as a molecular weight grows larger, a viscosity is increased, and handling becomes difficult.

In addition, in the present invention, the hydroxyethylcellulose is added so that a concentration relative to an electrolyte comprising an aqueous solution of sulfuric acid-copper sulfate becomes preferably 40 to 100 mg/L, more preferably 60 to 80 mg/L. When a concentration is lower than 40 mg/L, a roughness of a matte side is not reduced, and a tensile strength is remarkably reduced with time or accompanied with heat treatment. On the other hand, even when a concentration exceeds 100 mg/L, a desired electrodeposited copper foil with low surface roughness is obtained. However, as a concentration is increased, it becomes difficult to extinguish bubbles by oxygen expansion generated at an anode at electrolysis, bubbles are accumulated in an electrolysis tank or an electrolyte supplying tank, and it becomes difficult to continuously produce an electrodeposited copper foil. Therefore, from a viewpoint of production efficacy, it is preferable to retain a concentration of hydroxyethyl cellulose at 100 mg/L or lower.

There is a tendency that a preferable concentration range of the hydroxyethylcellulose is shifted to a low concentration side as a molecular weight grows larger.

Polyethyleneimine used in the present invention may be any of a linear polymer type represented by the following chemical formula 1 and a branch type represented by the following chemical formula 2, and both may be used by mixing them. Therefore, a ratio of the presence of primary, secondary and tertiary amines and the presence or the absence of a branch in a structure can be arbitrarily selected.

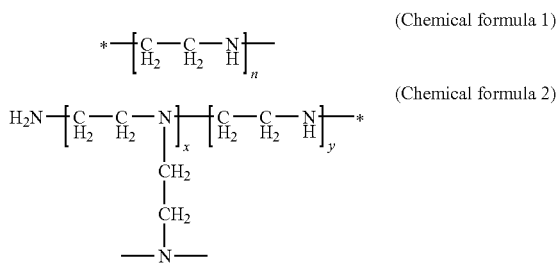

(Chemical formula 1)

(Chemical formula 2)

In addition, the polyethyleneimine used in the present invention has an average molecular weight of preferably 10000 to 75000, more preferably 10000 to 70000. When an average molecular weight is lower than 10000, an electrodeposited copper foil with low surface roughness having matte side appearance with high luminance is obtained. However, a tensile strength of the electrodeposited copper foil with low surface roughness is remarkably decreased with time or accompanied with heat treatment, and a tensile strength cannot be maintained high. On the other hand, when an average molecular weight exceeds 75000, reduction in a tensile strength with time or accompanied with heat treatment is suppressed, but there is a tendency that an elongation rate at a high temperature is reduced.

In the present invention, the polyethyleneimine is added to an electrolyte comprising an aqueous solution of sulfuric acid-copper sulfate so that a concentration becomes preferably 10 to 40 mg/L, more preferably 12 to 30 mg/L. When a concentration is lower than 10 mg/L, a roughness of a matte side is reduced, but a tensile strength is remarkably reduced with time or accompanied with heat treatment. When a concentration exceeds 40 mg/L, the plated state is not realized, but copper powders are precipitated, and the so-called scorching state is realized. And, there is a tendency that a concentration at which the plated state is transferred to the scorching state is shifted to a low concentration side as a molecular weight of the polyethyleneimine grows smaller.

The polyethyleneimine has nature of preventing reduction in a tensile strength with time or accompanied with heat treatment.

Acetylene glycol used in the present invention has an addition mole amount of ethylene oxide of preferably 10 moles or more. When an addition mole amount is less than 10 moles, for example, when an addition mole weight is 3.5 moles, compatibility with an electrolyte cannot be retained, and there is a possibility that acetylene glycol is separated and deposited in an electrolyte, polluting an electrodeposited copper foil.

In the present invention, acetylene glycol having the aforementioned addition mole amount of ethylene oxide of 10 moles or more is added to an electrolyte comprising an aqueous solution of sulfuric acid-copper sulfate so that a concentration becomes preferably 0.2 to 3.0 mg/L, more preferably 0.5 to 1.0 mg/L, because reduction of an elongation rate at a high temperature can be prevented while anti-foaming property is retained, in such the concentration range. When an addition amount is less than 0.2 mg/L, anti-foaming effect is not obtained sufficiently. On the other hand, when a concentration exceeds 3.0 mg/L, an elongation rate at a high temperature is reduced.

The acetylene glycol has nature of extinguishing bubbles by oxygen expansion at electrolysis generated accompanied with addition of the hydroxyethylcellulose. This effect is manifested even by addition of a small amount of acetylene glycol to an electrolyte.

A sulfonate salt of an active organic sulfur compound used in the present invention may be any of a symmetric or asymmetric disulfidosulfonate salt represented by the general formula: $NaSO_3$—$R_1$—S—S—$R_2$—$SO_3Na$, and a sulfonate salt of thiol represented by the general formula: HS—$R_1$—$SO_3Na$ or the general formula: HS—Ar—$SO_3Na$. In either case, it is important that a component is a sulfonate salt, and even when a hydroxyl group or a carboxyl group is added in order to obtain water-solubility, this has no effect on reduction in a size of electrodeposited copper. Representative compounds of a sulfonate salt of an active organic sulfur compound suitable in the present invention are represented by the following Chemical formula 3, Chemical formula 4, Chemical formula 5 and Chemical formula 6.

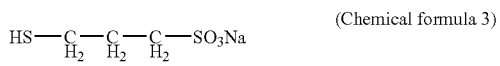

(Chemical formula 3)

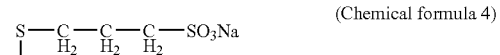

(Chemical formula 4)

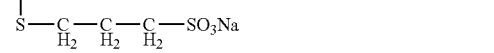

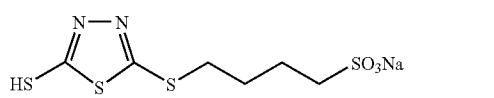

(Chemical formula 5)

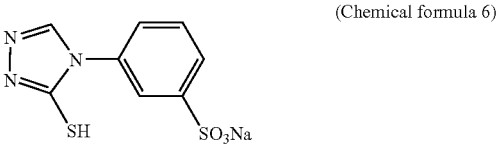

(Chemical formula 6)

In the present invention, it is not suitable to express an amount of the sulfonate salt of an active organic sulfur compound to be added to an electrolyte comprising an aqueous solution of sulfuric acid-copper sulfate, as a mass concentration. Paying attention to that the effect of a sulfonate salt of an active organic sulfur compound is determined by a thiol group present in the structure, sodium 3,3'-dithiodipropanesulfonate represented by Chemical formula 4 which is a two molecule-associated form of sodium 3-mercapto-1-propanesulfonate represented by Chemical formula 3 has two thiol groups, and even one molecule can obtain 2-fold effect of sodium 3-mercapto-1-propanesulfonate, therefore, the sulfonate salt can be defined by the mole number of thiols present in a molecule.

Then, when an amount of a present thiol group is expressed by a mole concentration, in the present invention, the sulfonate salt of an active organic sulfur compound is added to an electrolyte comprising an aqueous solution of sulfuric acid-copper sulfate so that a mole concentration becomes preferably 5.5 to 450 µmol/L, more preferably 55 to 180 µmol/L. When a mole concentration is less than 5.5 µmol/L, a roughness of a matte side is not reduced, and an elongation rate at a high temperature is low. On the other hand, even when a mole concentration exceeds 450 µmol/L, this does not influence on appearance and mechanical property of a precipitated electrodeposited copper foil. However, since the sulfonate salt of an active organic sulfur compound is expensive, increase in a mole concentration relative to an electrolyte consumes an active organic sulfur compound by useless oxidative degradation with a high anode potential of an insoluble anode, being not economical.

The presence of a chlorine ion in the present invention is very important and, in the case where a chlorine ion is not present in an electrolyte, even when four of the hydroxyethylcellulose, the polyethyleneimine, the acetylene glycol and the sulfonate salt of an active organic sulfur compound are adjusted in the aforementioned respective preferable concentration ranges, a desired electrodeposited copper foil with low surface roughness cannot be obtained. Only when a chlorine ion is present in an electrolyte, the technical object of the present invention is attained.

In the present invention, a chlorine ion is added to an electrolyte comprising an aqueous solution of sulfuric acid-copper sulfate so that a concentration becomes preferably 20 to 120 mg/L, more preferably 30 to 100 mg/L. When a concentration is lower than 20 mg/L, a roughness of a matte side is not reduced and, when a concentration exceeds 120 mg/L, gritty feeling is generated on a plated surface.

For supplying a chlorine ion, inorganic salts which are dissociated in an electrolyte and release a chlorine ion are used and, for example, NaCl and HCl are preferable.

In the present invention, by using an electrolyte in which five additives of the hydroxyethylcellulose, the polyethyleneimine, the sulfonate salt of an active organic sulfur compound, the acetylene glycol and a chlorine ion are added to an electrolyte comprising an aqueous solution of sulfuric acid-copper sulfate so as to adjust to the aforementioned respective preferable concentration ranges, respectively, employing a titanium plate coated with a platinum metal oxide in an anode, and a titanium cathode drum in a cathode, and performing electrolysis under the conditions of an electrode temperature of 35 to 50° C. and an electrolysis current density of 20 to 50 A/dm$^2$, a desired electrodeposited copper foil with low surface roughness can be obtained.

BEST MODE FOR CARRYING OUT THE INVENTION

Figure 1:
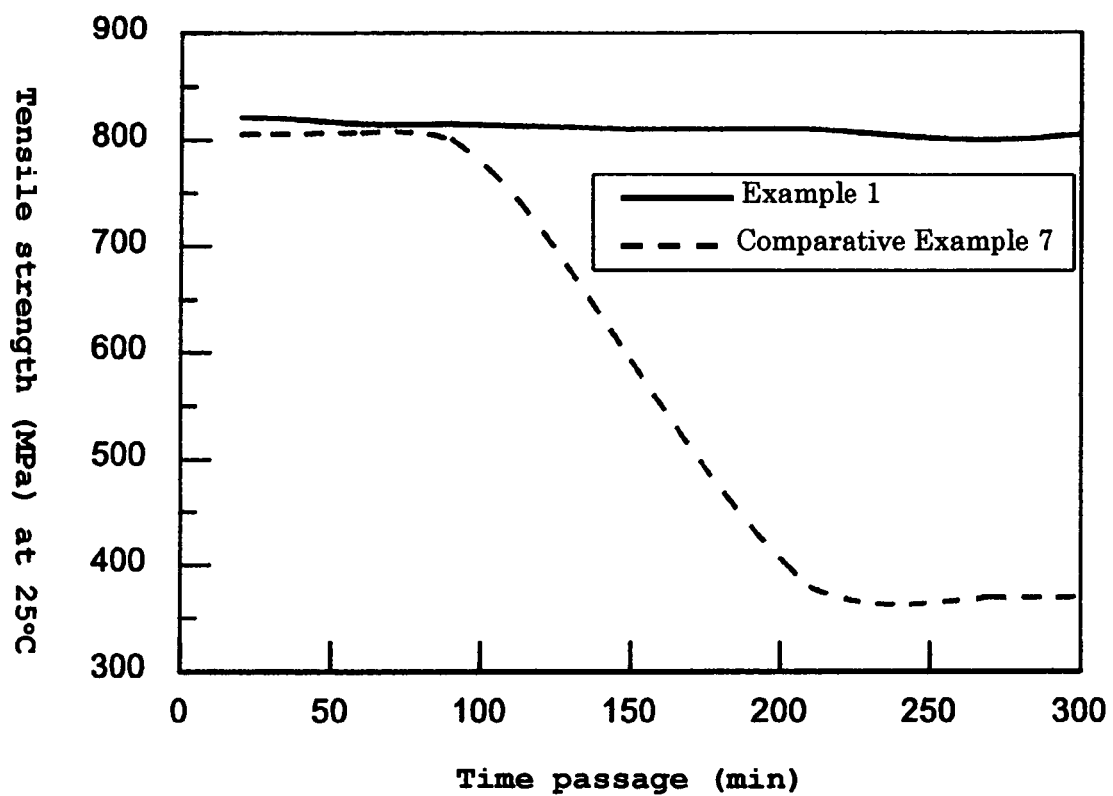
FIG. 1 is a graph showing a change in each tensile strength at 25° C. of an electrodeposited copper foil obtained in the best mode for carrying out the invention (electrodeposited copper foil without treatment) and an electrodeposited copper foil obtained in Comparative Example 7 (electrodeposited copper foil without treatment) with time.

First, best mode for carrying out the present invention is as follows.

An electrolyte comprising an aqueous solution of sulfuric acid-copper sulfate of sulfuric acid ($H_2SO_4$):100 g/L, and copper sulfate pentahydrate ($CuSO_4 \cdot 5H_2O$):280 g/L was prepared (hereinafter, this electrolyte is referred to as "fundamental electrolyte").

As an additive, hydroxyethylcellulose (trade name: HEC Daicel, product number: SP400, average molecular weight: 250000, manufactured by Daicel Chemical Industries, Ltd.), polyethyleneimine (trade name: Epomin, product number: P-1000, average molecular weight: 70000, manufactured by Nippon Shokubai Co., Ltd.), sodium 3-mercapto-1-propanesulfonate, acetylene glycol (tetra methyl decyl diol oxyethylene adduct, oxyethylene addition mole amount 10 moles, trade name: Surfinol, product number: 465, manufactured by Air Products) and hydrochloric acid were added to a fundamental electrolyte, and concentrations relative to a fundamental electrolyte were adjusted as follows: hydroxyethylcellulose: 70 mg/L, polyethyleneimine: 20 mg/L, sodium 3-mercapto-1-propanesulfonate: 100 mµmol/L, acetylene glycol: 0.5 mg/L, chlorine ion: 70 mg/L (see Table 1).

This electrolyte containing additives was filled between an insoluble anode of titanium coated with a platinum metal oxide and a titanium cathode drum which is a cathode, and electrodeposition was performed at an electrolysis current density: 40 A/dm$^2$ and an electrolyte temperature: 40° C. to obtain an electrodeposited copper foil with low surface roughness having a thickness of 18 µm.

And, the resulting electrodeposited copper foil with low surface roughness (electrodeposited copper foil without treatment) was subjected to the following respective measuring tests. First, a tensile strength (MPa) and an elongation rate (%) at 25° C. within 20 minutes from completion of electrodeposition were measured. Subsequently, as an accelerated test, heat treatment was performed in boiling water (100° C.) for 10 minutes and, thereafter, a tensile strength (MPa) and an elongation rate (%) at 25° C. were measured again. Further, this was re-heated, and a tensile strength (MPa) and an elongation rate (%) at 180° C. were measured. The aforementioned each tensile strength (MPa) and each elongation rate (%) were measured using a 2001-type tensile testing machine manufactured by Intesco based on IPC-TM-650. And, using the measurement results, a lowering rate (%) of a tensile strength at 25° C. after heat treatment was calculated. The lowering rate of a tensile strength is a numerical value obtained by dividing a difference between a tensile strength at 25° C. at completion of electrodeposition and a tensile strength at 25° C. after heat treatment by a tensile strength at 25° C. at completion of electrodeposition, and multiplying by 100. A surface roughness Rz of a matte side was measured using a surfcoder SE-1700α manufactured by Kosaka Laboratory Ltd. based on JIS B 0601. Results of respective measurement tests are shown in Table 2.

Then, Examples 1 to 4 of the present invention and Comparative Examples 1 to 9 are as follows.

Under the same conditions as respective conditions in the best mode for carrying out the present invention except that a kind and a concentration relative to a fundamental electrolyte of additives, as well as an electrolysis current density and an electrolyte temperature were changed as shown in Table 1, electrodeposited copper foils having a thickness of 18 μm were obtained.

And, the same measuring tests as respective measuring tests in the best mode for carrying out the present invention were performed on the resulting respective electrodeposited copper foils (electrodeposited copper foil without treatment). Results of respective measuring tests are shown in Table 2.

In Comparative Examples 8 and 9, since scorching occurred, an electrodeposited copper foil could not be obtained, and this is expressed by a mark "-" in Table 2.

TABLE 1

| | Additive concentration | | | | | | | Electrolysis conditions | |
|---|---|---|---|---|---|---|---|---|---|
| | Hydroxyethyl cellulose (mg/l) | Polyethyl- eneimine (mg/l) | Acetylene glycol (mg/l) | 3-Mercapto-1- propane- sulfonic acid (μmol/l) | Chlorine ion (mg/l) | Gelatin (mg/l) | Polyethylene glycol (mg/l) | Current density (A/dm$^2$) | Solution temperature (° C.) |
| Best mode for carrying out the invention | 70$^{(2)}$ | 20$^{(4)}$ | 0.5 | 100 | 70 | — | — | 40 | 40 |
| Example 1 | 80$^{(2)}$ | 30$^{(5)}$ | 0.7 | 170 | 80 | — | — | 40 | 40 |
| Example 2 | 60$^{(2)}$ | 12$^{(5)}$ | 0.5 | 60 | 30 | — | — | 40 | 40 |
| Example 3 | 60$^{(1)}$ | 12$^{(4)}$ | 0.5 | 60 | 35 | — | — | 40 | 40 |
| Example 4 | 80$^{(1)}$ | 20$^{(4)}$ | 1.0 | 180 | 90 | — | — | 40 | 40 |
| Comparative Example 1 | 80$^{(2)}$ | 12$^{(6)}$ | 0.6 | 160 | 60 | — | — | 50 | 50 |
| Comparative Example 2 | 70$^{(3)}$ | 6$^{(5)}$ | 0.5 | 100 | 70 | — | — | 40 | 45 |
| Comparative Example 3 | 70$^{(2)}$ | 0.5$^{(5)}$ | 0.5 | 100 | 70 | — | — | 40 | 45 |
| Comparative Example 4 | 20$^{(2)}$ | 20$^{(5)}$ | 0.5 | 60 | 50 | — | — | 40 | 40 |
| Comparative Example 5 | 60$^{(2)}$ | 20$^{(5)}$ | 3.5 | 60 | 35 | — | — | 40 | 40 |
| Comparative Example 6 | — | — | — | — | 35 | 0.2$^{(9)}$ | — | 45 | 40 |
| Comparative Example 7 | 5.0$^{(2)}$ | — | — | 5.5 | 30 | 0.1$^{(10)}$ | — | 50 | 60 |
| Comparative Example 8 | 2.0 × 10$^{3(2)}$ | 0.2 × 10$^{3(4)}$ | — | 1000 | — | — | 0.2 × 10$^3$ | 50 | 60 |
| Comparative Example 9 | 5.0 × 10$^{3(2)}$ | 0.5 × 10$^{3(4)}$ | — | 1000 | 35 | — | 0.6 × 10$^3$ | 50 | 60 |

$^{(1)}$Hydroxyethyl cellulose (trade name: HEC Daicel, product number: SP600, average molecular weight: 1020000, manufactured by Daicel Chemical Industries, Ltd.)
$^{(2)}$Hydroxyethyl cellulose (trade name: HEC Daicel, product number: SP400, average molecular weight: 250000, manufactured by Daicel Chemical Industries, Ltd.)
$^{(3)}$Hydroxyethyl cellulose (trade name: HEC Daicel, product number: SP200, average molecular weight: 120000, manufactured by Daicel Chemical Industries, Ltd.)
$^{(4)}$Polyethyleneimine (trade name: Epomin, product number: P-1000, average molecular weight: 70000, manufactured by Nippon Shokubai Co., Ltd.)
$^{(5)}$Polyethyleneimine (trade name: Epomin, product number: SP-200, average molecular weight: 10000, manufactured by Nippon Shokubai Co., Ltd.)
$^{(6)}$Polyethyleneimine (trade name: Epomin, product number: SP-018, average molecular weight: 1800, manufactured by Nippon Shokubai Co., Ltd.)
$^{(7)}$Acetylene glycol (trade name: Surfinol, product number: 465, manufactured by Air Products)
$^{(8)}$Polyethylene glycol (trade name: PEG, product number: PEG2000, average molecular weight: 2000, manufactured by Sanyo Chemical Industries, Ltd.)
$^{(9)}$Gelatin (trade name: powdery gelatin (polymer), product number: YK, manufactured by Yasu Chemical Inc.)
$^{(10)}$Gelatin (trade name: water-soluble gelatin, product number: U, manufactured by Nitta Gelatin Inc.)

TABLE 2

| | Room temperature (25° C.) | | After heat treatment (100° C. 10 min.) | | Reduction rate in tensile strength (%) | High temperature (180° C.) | | Surface roughness | |
|---|---|---|---|---|---|---|---|---|---|
| | At completion of electrodeposition | | | | | | | | |
| | Tensile strength (MPa) | Elonga- tion rate (%) | Tensile strength (MPa) | Elonga- tion rate (%) | | Tensile strength (MPa) | Elonga- tion rate (%) | Matte side (μm) | Shiny side (μm) |
| Best mode for carrying out the invention | 820 | 6.5 | 800 | 7.0 | 2.4 | 210 | 15.0 | 2.0 | 2.2 |
| Example 1 | 890 | 5.0 | 890 | 6.0 | 0 | 205 | 9.0 | 2.3 | 2.2 |
| Example 2 | 900 | 4.0 | 880 | 7.0 | 2.2 | 185 | 17.0 | 1.5 | 2.2 |
| Example 3 | 650 | 6.0 | 600 | 7.0 | 7.7 | 210 | 6.0 | 2.2 | 2.2 |
| Example 4 | 880 | 4.0 | 860 | 3.8 | 2.3 | 205 | 7.0 | 2.0 | 2.2 |
| Comparative Example 1 | 720 | 10.0 | 350 | 10.0 | 51.4 | 215 | 3.5 | 2.2 | 2.1 |

TABLE 2-continued

| | Room temperature (25° C.) | | | | High temperature (180° C.) | | Surface roughness | |
|---|---|---|---|---|---|---|---|---|
| | At completion of electrodeposition | | After heat treatment (100° C. 10 min.) | | Reduction rate in tensile strength (%) | | | |
| | Tensile strength (MPa) | Elongation rate (%) | Tensile strength (MPa) | Elongation rate (%) | | Tensile strength (MPa) | Elongation rate (%) | Matte side (μm) | Shiny side (μm) |
| Comparative Example 2 | 800 | 6.5 | 400 | 7.0 | 50.0 | 210 | 2.0 | 3.2 | 2.1 |
| Comparative Example 3 | 800 | 7.0 | 380 | 10.0 | 52.5 | 205 | 15.0 | 2.0 | 2.1 |
| Comparative Example 4 | 600 | 3.0 | 390 | 3.2 | 35.0 | 210 | 105.0 | 2.8 | 2.0 |
| Comparative Example 5 | 800 | 5.0 | 780 | 5.0 | 2.5 | 220 | 2.5 | 2.2 | 2.0 |
| Comparative Example 6 | 330 | 5.0 | 330 | 5.0 | 0 | 210 | 1.8 | 3.5 | 2.0 |
| Comparative Example 7 | 800 | 7.0 | 320 | 9.2 | 60.0 | 205 | 18.0 | 1.9 | 2.1 |
| Comparative Example 8 | — | — | — | — | — | — | — | — | — |
| Comparative Example 9 | — | — | — | — | — | — | — | — | — |

In addition, regarding respective electrodeposited copper foils (electrodeposited copper foil without treatment) obtained in the best mode for carrying out the present invention and Comparative Example 7, a tensile strength (MPa) was measured every 20 minutes from electrodeposition completion in the state where room temperature was retained at 25° C., using a 2001-type tensile testing machine manufactured by Intesco based on IPC-TM-650. Results are shown in a graph of FIG. 1. In the graph, an ordinate axis indicates a tensile strength (MPa), an abscissa axis indicates a time (min) passed from electrodeposition completion, measurement results of an electrodeposite copper foil with low surface roughness obtained in the best mode for carrying out the present invention are indicated by a solid line, and measurement results of an electrodeposited copper foil with low surface roughness obtained in Comparative Example 7 are indicated by a dotted line.

From the graph of FIG. 1, it can be confirmed that, in an electrodeposited copper foil obtained in Comparative Example 7, a tensile strength is remarkably reduced as a time passes from electrodeposition completion, while in an electrodeposited copper foil obtained in the best mode for carrying out the present invention, a high tensile strength is maintained even when a time passes from electrodeposition completion.

A lowering rate of a tensile strength at 25° C. measured after 100 minutes from electrodeposition completion, of an electrodeposited copper foil obtained in the best mode for carrying out the present invention was 0.7%, a lowering rate of a tensile strength at 25° C. measured after 200 minutes was 1.3%, and a lowering rate of a tensile strength at 25° C. measured after 300 minutes was 1.9%.

Figure 2:
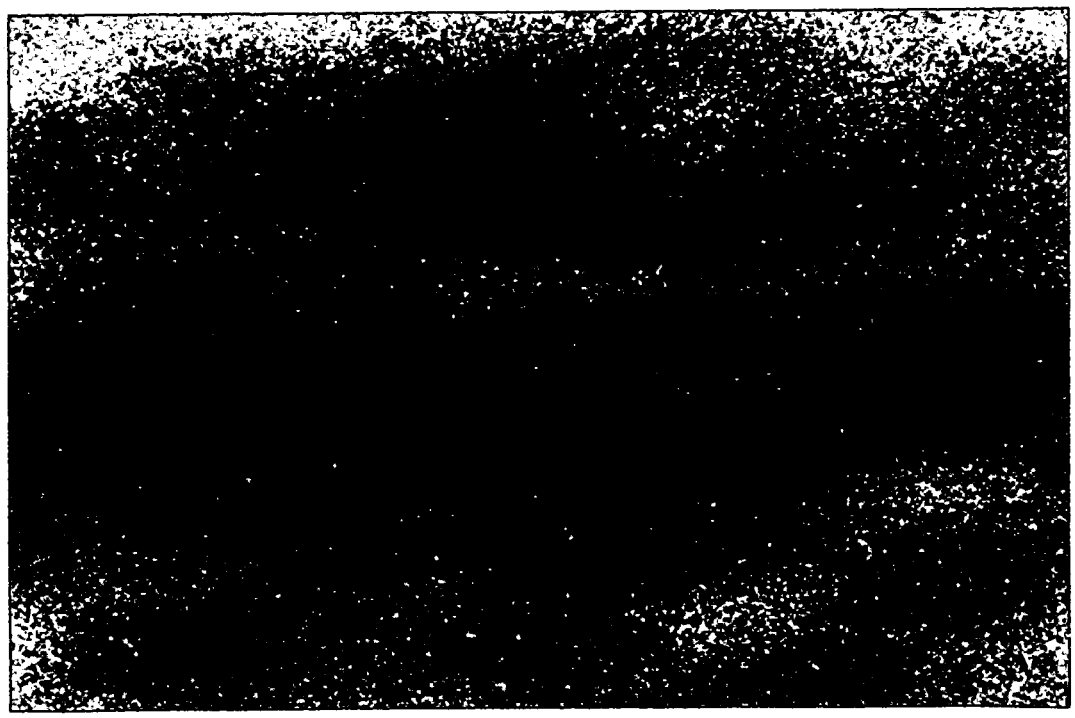
FIG. 2 is an electron micrograph (magnification×1000) taking a matte side of an electrodeposited copper foil obtained in the best mode for carrying out the present invention (electrodeposited copper foil without treatment).
Figure 3:
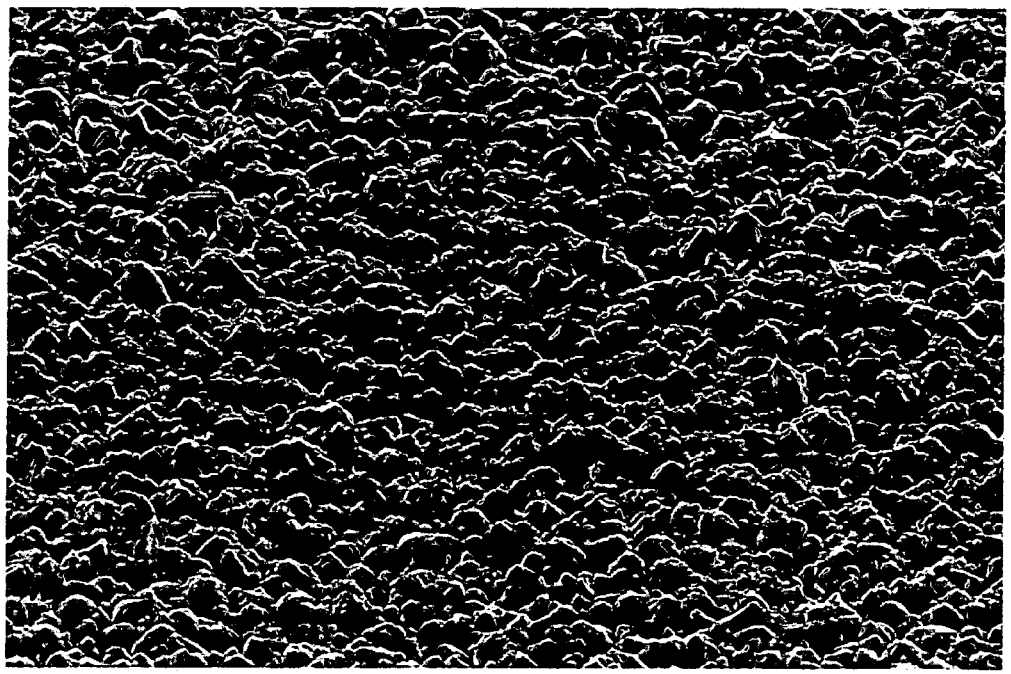
FIG. 3 is an electron micrograph (magnification×1000) taking a matte side of an electrodeposited copper foil obtained in Comparative Example 6 (electrodeposited copper foil without treatment).

FIG. 2 is an electron micrograph (magnification×1000) taking a matte side of an electrodeposited copper foil (electrodeposited copper foil without treatment) obtained in the best mode for carrying out the present invention, and FIG. 3 is an electron micrograph (magnification×1000 taking a matte side of an electrodeposited copper foil (electrodeposited copper foil without treatment) obtained in Comparative Example 6. When both micrographs are compared, it can be confirmed that a roughness of a matte side of an electrodeposited copper foil obtained in the best mode for carrying out the present invention is reduced.

INDUSTRIAL APPLICABILITY

According to the present invention, an electrodeposited copper foil with low surface roughness (electrodeposited copper foil without treatment) having a reduced roughness of a matte side roughness Rz of 2.5 μm, a low lowering rate of a tensile strength with time or accompanied with heat treatment, and an excellent elongation rate at a high temperature, which is optimal in utility of a printed circuit board and a lithium ion secondary cell anode current collecting body can be provided.

The invention claimed is:

1. An electrodeposited copper foil with low surface roughness, comprising a matte side roughness Rz of an electrodeposited copper foil is 2.5 μm or less, a tensile strength at 25° C. measured within 20 minutes from completion of electrodeposition is 880 MPa or higher and, at the same time, a lowering rate of a tensile strength at 25° C. measured after 300 minutes from completion of electrodeposition is 10% or lower.

2. An electrodeposited copper foil with low surface roughness, comprising a matte side roughness Rz of an electrodeposited copper foil is 2.5 μm or lower, a tensile strength at 25° C. measured within 20 minutes from completion of electrodeposition is 880 MPa or higher and, at the same time, a lowering rate of a tensile strength at 25° C. measured after heat treatment at 100° C. for 10 minutes from completion of electrodeposition is 10% or lower.

* * * * *